United States Patent
Nakagawa

(10) Patent No.: US 6,971,155 B2
(45) Date of Patent: Dec. 6, 2005

(54) METHOD OF MANUFACTURING A MAGNETIC HEAD

(75) Inventor: Masayoshi Nakagawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 110 days.

(21) Appl. No.: 10/164,933

(22) Filed: Jun. 6, 2002

(65) Prior Publication Data

US 2002/0186509 A1 Dec. 12, 2002

(30) Foreign Application Priority Data

Jun. 8, 2001 (JP) .................................. 2001-173961

(51) Int. Cl.[7] .......................... G11B 5/127; H04R 31/00
(52) U.S. Cl. ............................. 29/603.06; 29/603.03; 29/603.04; 29/854; 360/122; 360/126; 360/317; 228/181; 228/190
(58) Field of Search ...................... 29/603.04, 603.06, 29/854; 360/122, 126, 317; 228/181, 190

(56) References Cited

U.S. PATENT DOCUMENTS

| | | | |
|---|---|---|---|
| 4,761,699 A | * | 8/1988 | Ainslie et al. ........... 360/234.5 |
| 5,729,896 A | | 3/1998 | Dalal et al. |
| 5,734,523 A | | 3/1998 | Scheidecker et al. ....... 360/103 |
| 5,757,585 A | * | 5/1998 | Aoyagi et al. ........... 360/234.5 |
| 5,873,159 A | | 2/1999 | Arya et al. ............... 29/603.03 |
| 5,896,247 A | * | 4/1999 | Pan et al. ................. 360/234.5 |
| 5,963,383 A | | 10/1999 | Jurgenson ................. 360/10 X |
| 6,198,599 B1 | | 3/2001 | Senuma |

FOREIGN PATENT DOCUMENTS

| | | | | |
|---|---|---|---|---|
| JP | 11023432 A | * | 1/1999 | ............ G01N/1/28 |
| JP | 11-250433 | | 9/1999 | |
| JP | 2001-28112 | | 1/2001 | |
| JP | 2001-44616 | | 2/2001 | |

OTHER PUBLICATIONS

"Chip on suspension MR head"; Shiraishi, M.; IEMT/IMC Symposium, 2nd 1998, Apr. 15–17, 1998; pp.:333–336.*
Copy of Japanese Office Action dated Aug. 13, 2004 for Japanese Patent Application 2001-173961.

* cited by examiner

*Primary Examiner*—Paul Kim
(74) *Attorney, Agent, or Firm*—Brinks Hofer Gilson & Lione

(57) ABSTRACT

One joint member having a melting point different from that of the other joint member is joined to each bonding pad of a slider and further joined to each bonding pad of a suspension through the other joint member. The slider is exfoliated from the suspension in the state that the one joint member is attached to the slider by heating and melting the other joint member.

9 Claims, 5 Drawing Sheets

TRAILING SIDE ← → LEADING SIDE

METHOD OF MANUFACTURING A MAGNETIC HEAD

This application claims the benefit of priority to Japanese Patent Application 2001-173961, filed on Jun. 8, 2001.

BACKGROUND OF THE INVENTION

1. Field of the Invention

The present invention relates to a method of manufacturing a magnetic head and a method of exfoliating a slider.

2. Description of the Related Art

As shown in FIGS. 6 and 7, this type of a magnetic head is composed of a suspension 1 and a slider 2 mounted on the suspension 1. The magnetic head is used to record and replay data on and from, for example, a hard disc, and the electric characteristics of the magnetic head are inspected before it is shipped. The characteristic inspection includes a static characteristic inspection and a dynamic characteristic inspection.

The static characteristic inspection is carried out by facing a magnetic head to a magnetic disc through a slider simple body. However, the dynamic characteristic inspection that is carried out in the state in which the slider is mounted on a suspension and moreover floated over the magnetic disc in rotation is used as a basis for finally determining whether the magnetic head is acceptable or not. Thus, the dynamic characteristic inspection is emphasized in the characteristic inspection. A magnetic head as a final product in which a slider is mounted on a suspension is used in the dynamic characteristic inspection. When the dynamic characteristic inspection is carried out, the spring load characteristics of the suspension are required to fall within a certain standard because the output obtained by the characteristic inspection is affected by the floating attitude of the floating slider.

To make a conventional magnetic head, first, a slider 2 is mounted on a suspension 1 in the state in which the bonding pad 1a of the suspension 1 faces the bonding pad 2a of a slider 2, and the slider 2 is bonded to the suspension 1 by a polyimide 3, as shown in FIG. 5A. Note that the portion where the suspension 1 is joined to the slider 2 is supported by a jig 5 from under it.

Next, a gold wire is formed in a spherical shape by electric discharging as shown in FIG. 5A, and an ultrasonic wave is applied to a spherical gold ball 4 while the bonding pad 1a of the suspension 1 remains in press-contact with the bonding pad 2a of the slider 2 as shown in FIG. 5B, thereby the press-contact surface of the gold ball 4 is joined to the bonding pads 1a and 2a, respectively. The bonding pad 2a of the slider 2 is connected to an electromagnetic transducer element assembled in the slider 2. The electromagnetic transducer element is used to replay data recorded on a recording medium and to record data to the recording medium.

Since the electromagnetic transducer element assembled in the slider 2 has a low heat resistant temperature, a joint method in which an ultrasonic wave is used in combination with the gold ball 4 is ordinarily employed.

When a recording density is low, a ratio of defective products found in the dynamic characteristic inspection carried out by mounting a slider on a suspension is very small and problems do not particularly arise. Here, most of the cases in which sliders are determined defective by the dynamic characteristic inspection are the cases that electromagnetic transducer elements cannot not exhibit characteristics necessary to replay and record data. Recently, as the recording density is increased, an expensive component such as a micromotion tracking device and an IC is mounted on the suspension in many cases to cope with it. Thus, it is a wasteful use of resources to discard a suspension on which a defective slider is mounted together with the slider because of a reason that the slider is defective, and it is contemplated that the suspension must be reworked and reused for the effective use of the suspension.

In the conventional magnetic head, it is contemplated to forcibly exfoliate the slider 2 from the suspension 1 by continuously applying metal fatigue to the gold ball 4 to remove the slider 2 from the suspension 1. In this method, however, similar metal fatigue is also applied to the suspension 1, and the spring load characteristics of the suspension 1 fall outside of the standard. Therefore, this method is not suitable to rework and reuse the suspension 1.

SUMMARY OF THE INVENTION

An object of the present invention is to obtain a magnetic head having a joint structure most suitable to exfoliate a slider and a structure by which an acceptable slider can be reliably fixed to a suspension, a method of manufacturing the magnetic head, and a method of exfoliating the slider.

To achieve the above object, a magnetic head according to the present invention includes a suspension, a slider mounted on the suspension, electromagnetic transducer elements assembled to the slider, bonding pads disposed to the slider and connected to the electromagnetic transducer elements, bonding pads disposed to the suspension and connected to the bonding pads of the slider, and at least two types of joint members one of which is connected to each bonding pad of the slider and further connected to each bonding pad of the suspension through the other of the joint members.

It is preferable that the one joint member also act as a radiator for radiating the heat produced by the other joint member when it is joined. It is preferable that the other joint member be composed of a material whose melting point is lower than the heat resistant temperature of the electromagnetic transducer element.

It is preferable that the surface area of the one joint member be increased. Further, it is preferable that the one joint member be composed of a gold material and that the other joint member be composed of a solder material.

In a method of manufacturing a magnetic head according to the present invention in which the bonding pads of a suspension are joined to the bonding pads of a slider mounted on the suspension through at least two types of joint members, the slider has electromagnetic transducer elements assembled thereto, and the bonding pads of the slider are connected to the electromagnetic transducer elements, the method includes the steps of joining one of at least the two types of the joint members to each bonding pad of the slider, attaching the one of the joint members to the other of the joint member, and joining the one joint member to each bonding pad of the suspension through the other joint member.

In a method of manufacturing a magnetic head according to the present invention in which the bonding pads of a suspension are joined to the bonding pads of a slider mounted on the suspension through at least two types of joint members, the slider has electromagnetic transducer elements assembled thereto, and the bonding pads of the slider are connected to the electromagnetic transducer elements, the method includes the steps of setting the other of at least the two types of the joint members and the slider on a jig, joining one of at least the two types of the joint members to each bonding pad of the slider on the jig as well as attaching the one joint member to the other joint member, moving the slider from the jig onto the suspension in the state that the one joint member is bonded to the slider and joining the one joint member to each bonding pad of the suspension through the other joint member, wherein the jig comprises a member unlike to be joined to the joint members.

The method may include the step of increasing the surface area of the one joint member by pressing it after the other joint member has been attached to the one joint member.

A wire member acting as the one joint member may be formed in a spherical shape, and the spherical wire member may be joined to each bonding pad of the slider by applying an ultrasonic wave to the wire member in the state that it is in press-contact with the bonding pad of the slider. The one joint member may be formed on each bonding pad of the slider using a plating method. Further, the one joint member may be joined to each bonding pad of the suspension by using solder as the other joint member and melting the solder.

Further, in a method of exfoliating a slider from a suspension of a magnetic head that includes the slider and the suspension and in which one joint member having a melting point different from that of the other joint member is joined to each bonding pad of the slider and further joined to each bonding pad of the suspension through the other joint member, the method includes the steps of exfoliating the slider from the suspension in the state that the one joint member is attached to the slider by heating and melting the other joint member.

BRIEF DESCRIPTION OF THE DRAWING

FIGS. 1A to 1C are sectional views showing a method of manufacturing a magnetic head according to an embodiment of the present invention in the sequence of manufacturing processes, wherein FIG. 1C is the sectional view showing the magnetic head according to the embodiment of the present invention as a finished product.

DESCRIPTION OF THE PREFERRED EMBODIMENTS

Embodiments of the present invention will be described below together with illustrated examples.

Figure 1A:
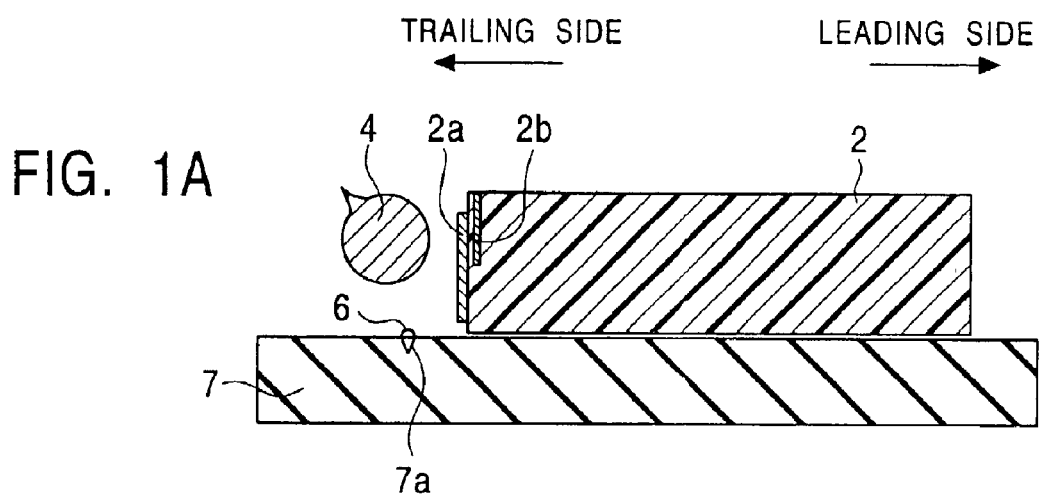
Figure 1B:
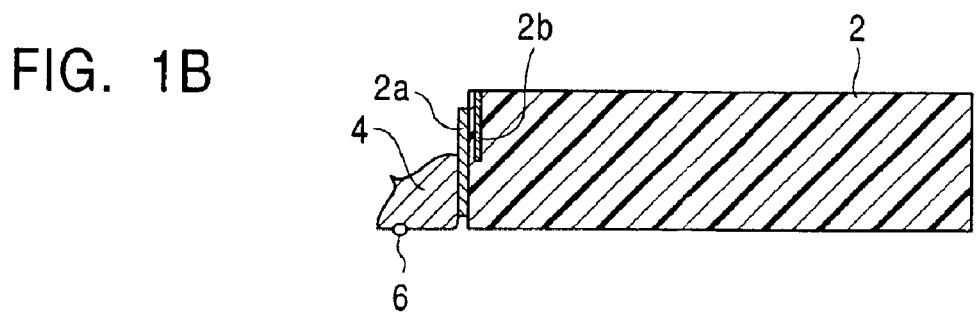
Figure 1C:
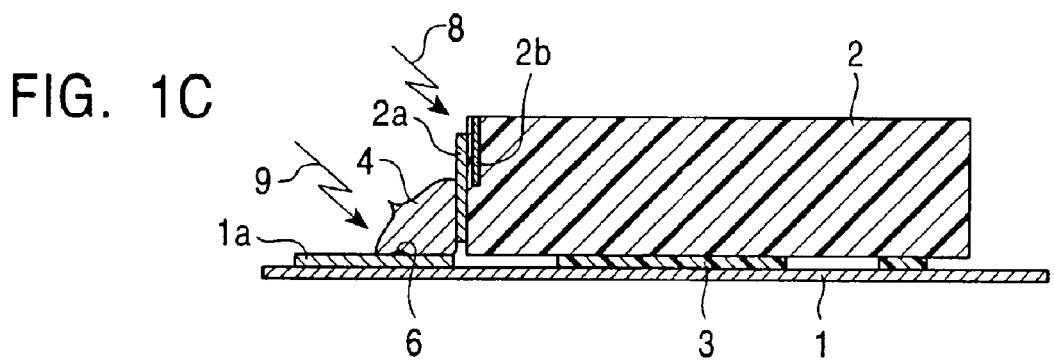
Figure 1D:
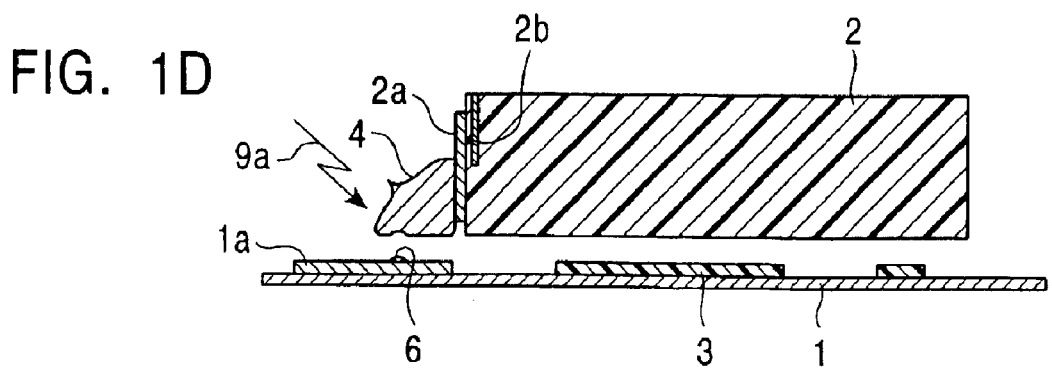
FIG. 1D is a sectional view showing the state in which the slider is exfoliated from the magnetic head according to the embodiment of the present invention.

FIGS. 1A to 1C are sectional views showing a method of manufacturing a magnetic head according to an embodiment of the present invention in the sequence of manufacturing processes. Further, FIG. 1C is the sectional view showing the magnetic head according to the embodiment of the present invention as a finished product. FIG. 1D is a sectional view showing the state in which the slider is exfoliated from the magnetic head according to the embodiment of the present invention.

This embodiment includes a suspension 1 and a slider 2 mounted on the suspension 1. The slider 2 of the embodiment includes electromagnetic transducer elements 2b. The electromagnetic transducer elements 2b of the slider 2 are disposed on the side surface of the slider 2, which floats over a magnetic disc, on the air flowing-out side of the slider 2 such that an end of each electromagnetic transducer element 2b reaches the facing surface (ABS surface) of a recording medium such as a hard disc in order to record and replay data to and from the recording medium. When each electromagnetic transducer element 2b disposed to the slider 2 acts as a magnetic resistance effect element (MR element), it replays data from the recording medium making use of that an electric resistance value is changed by a magnetic field from the recording medium. Further, when each electromagnetic transducer element 2b acts as a recording (record data writing) element, it records data to the recording medium in response to a magnetic field produced by supplying a data recording current to a coil.

Further, the suspension 1 has bonding pads 1a and the slider 2 has bonding pads 2a, respectively, and the bonding pads 1a are connected to the bonding pads 2a through joint members 4 and 6. The joint members 4 and 6 of the embodiment are composed of at least two types of joint members 4 and 6 each having a different melting point. Since the bonding pad 2a is connected to the electromagnetic transducer element 2b, the electromagnetic transducer element 2b is affected by the heat applied to the bonding pad 2a when the bonding pad 2a is joined.

In the embodiment, one of the joint members 4 and 6, that is, the joint member 4 is joined to the bonding pad 2a of the slider 2 and further joined to the bonding pad 1a of the suspension 1 through the other joint member 6. Incidentally, the electromagnetic transducer element 2b acting as the replaying element described above is particularly easily affected by heat, and when it is exposed to a temperature of several hundreds of degrees, the characteristics thereof are lost.

To cope with this problem, in the embodiment, the one joint member 4 also acts as a radiator for radiating the heat produced by the other joint member 6 when it is joined. Further, the other joint member 6 is composed of a material whose melting point is lower than the heat resistant temperature of the electromagnetic transducer elements 2b assembled to the slider 2. In the embodiment, a gold ball is used as the one joint member 4, and a solder material is used as the other joint member 6. It is preferable to use solder composed of gold/lead/tin alloy, indium, or indium/tin alloy as the solder material. In particular, when the solder composed of the indium/tin alloy having a melting temperature of about 117° C. is used, it is possible to prevent the electromagnetic transducer elements 2b of slider 2 from being adversely affected thermally.

Figure 2A:
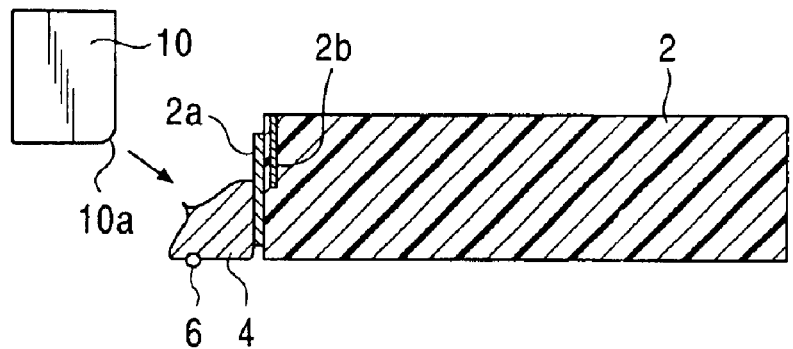
FIGS. 2A and 2B are sectional views showing a method of manufacturing a magnetic head according to another embodiment of the present invention in the sequence of manufacturing processes.
Figure 2B:
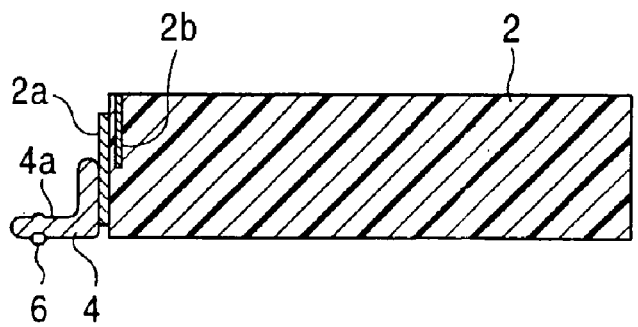
Figure 3:
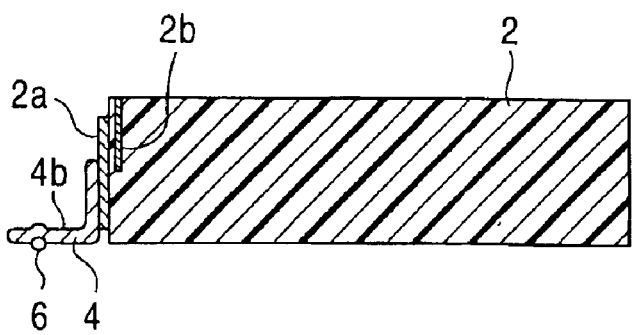
FIG. 3 is a sectional view showing a method of manufacturing a magnetic head according to still another embodiment of the present invention.

Further, as shown in FIGS. 2B and 3, the thermally adverse effect on the electromagnetic transducer elements 2b of the slider 2 may be prevented by effectively dispersing the heat produced by the other joint member 6 when it is melted by increasing the surface area of the one joint member 4.

As described above, according to the embodiment, at least the two types of the joint members 4 and 6 each having the different melting point are used, and the one joint members 4 are joined to the bonding pads 2a of the slider 2 and further joined to the bonding pads 1a of the suspension 1 through the other joint members 6 making use of that they have the different melting point. Accordingly, the joint member 6 to be soldered is not directly joined to the bonding pad 2a of the slider 2, and the joint member 4 is interposed between the bonding pad 2a of the slider 2 and the joint member 6. Thus, the joint member 4 acts as a cushion (buffer). Further, since the heat produced when the joint member 6 is melted is accumulated in the other joint member 4 and diffused from the surface thereof, it is possible to prevent the thermally adverse effect from transmitting to the electromagnetic transducer element 2b of the slider 2, thereby the manufacturing yield of the magnetic heads can be improved.

Further, the one joint member 4 is joined to the bonding pad 1a of the suspension 1 soldering the other joint member 6. Thus, the slider 2 can be exfoliated from the suspension 1 by releasing the one joint member 4 from the bonding pad 1a of the suspension 1 to which it is joined by melting the other joint member 6 by the heat applied thereto locally. Thus, no unnatural force is applied to the suspension 1. Accordingly, the spring load characteristics of the suspension 1 having been exfoliated from a defective slider 2 fall within the standard, and thus the suspension 1 can be easily reworked and reused.

Further, since the one joint member 4 is joined to the bonding pad 1 a of the suspension 1 by soldering the joint member 6, the slider 2 is not tentatively attached only for inspecting the dynamic electric characteristics thereof but reliably fixed to the suspension 1. As a result, when it is determined that the slider 2 is an acceptable product as a result of the dynamic electric characteristic inspection, a job for finally attaching the slider 2 is not necessary, thereby no problem arises from the arrangement for easily exfoliating the slider 2.

When the gold ball is selected as the one joint member 4 and the solder material is selected as the other joint member 6, respectively, the gold ball 4 is not oxidized when it is joined through the solder material 6 because it is difficult for the surface of the gold ball 4 to be oxidized. Thus, the joint strength between the gold ball 4 and the bonding pad 1a of the suspension 1 is not deteriorated. Further, it is possible to penetrate the solder material 6 into the interface between the gold ball 4 and the bonding pad 1a of the suspension 1 making use of the wettability of the gold ball 4 to the solder material 6, thereby the joint strength thereof can be improved. Note that while the gold ball 4 is used as the one joint member 4, a gold wire or a gold sheet (ribbon) may be used in place of the gold ball.

Next, a manufacturing method of assembling the magnetic head of the embodiment as a magnetic head capable of being subjected to the dynamic electric characteristic inspection. In the manufacturing method, the gold ball is used as the one joint member 4, and the solder material formed in a ball-shape is used as the other joint member 6.

As shown in FIG. 1A, first, the ball-shaped solder material 6 is set to the dimple 7a of a jig 7 as well as the slider 2 is set on the jig 7 with the bonding pad 2a facing the ball-shaped joint member 6. The jig 7 is composed of a material of $Al_2O_3$, $ZrO_2$, etc. and processed such that it is unlikely for the jig 7 to be joined to the gold ball 4 and to the ball-shaped solder material 6 that are melted.

Next, as shown in FIGS. 1A and 1B, an extreme end of a gold wire is formed in a spherical shape by being subjected to electric discharging, and an ultrasonic wave is applied to the spherical gold ball 4 in the state that the gold ball 4 is in press-contact with the bonding pad 2a of the slider 2 and the jig 7, and the gold ball 4 is joined to the bonding pad 2a of the slider 2 through the press-contact surface thereof as well as the ball-shaped solder material 6 is attached to a part of the gold ball 4. The part of the gold ball 4 indicates the position of the gold ball 4 on the side thereof facing the bonding pad 1a of the suspension 1. In soldering, two members to be joined have such characteristics that when the temperature thereof does not reach the melting point of solder, it is impossible to solder them. According to the characteristics, when the ball-shaped solder material is to be attached to the gold ball 4, since the portion to which the ball-shaped solder material 6 is attached is not heated, the ball-shaped solder material 6 is attached to the gold ball 4 in a ball state without being melted. Further, since the jig 7 is processed such that it is difficult for the jig 7 to be joined to the joint member 4 and to the ball-shaped solder material 6 that are melted as described above, the gold ball 4 is not joined to the jig 7 even if it is bonded by the ultrasonic wave.

Next, as shown in FIG. 1C, the slider 2 assembled in the state shown in FIG. 1B is mounted on the suspension 1 and aligned such that the bonding pad 2a of the slider 2 faces the bonding pad 1b of the suspension 1, and the slider 2 is set to the suspension 1. Thereafter, the slider 2 is bonded to the suspension 1 with the polyimide 3 as well as the two bonding pads 1a and 2a begin to be joined together.

When the two bonding pads 1a 2a are joined together, the suspension 1 and the slider 2 are set in an inert gas atmosphere, and the portion where the gold ball 4 is joined to the bonding pad 1a of the suspension 1 is shut off from an oxygen atmosphere through an inert gas 8 while cooling the bonding pad 2a side of the slider 2 with the inert gas 8.

Next, the ball-shaped solder material 6 is melted with a fine beam-shaped heating light 9, the melted solder material 6 is penetrated into the interface between the gold ball 4 and the bonding pad 1a of the suspension 1 making use of the wettability of the surface of the gold ball 4, and the gold ball 4 is joined to the bonding pad 1a of the suspension 1 through the solder material 6.

Then, the magnetic head arranged as a product shown in FIG. 1C is subjected to the dynamic electric characteristic inspection. When the slider 2 mounted on the suspension 1, in particular, the electromagnetic transducer element 2b does not exhibit an intended performance and is determined to be a defective product as a result of the dynamic electric characteristic inspection, the slider 2 is discarded.

As described above, according to the manufacturing method of the embodiment, the gold ball 4 is previously joined to the bonding pad 2a of the slider 2 and then joined to the bonding pad 1a of the suspension 1 through the solder material 6. Accordingly, when the ball-shaped solder material 6 is melted, the gold ball 4 acts as a cushion (buffer) and shuts off the transmission of the heat of the solder 6 to the slider 2. As a result, no adverse thermal effect is exerted to the electromagnetic transducer element 2b of the slider 2, thereby an accident that the electromagnetic transducer element 2b of the slider 2 is injured in the process for aligning the magnetic head can be greatly reduced and the manufacturing yield of the magnetic head can be improved.

Further, when the bonding pad 1a of the suspension 1 is bonded to the gold ball 4 by the solder material 6, they are joined together by penetrating the solder material 6 into the interface between the gold ball 4 and the bonding pad 1a of the suspension 1. Thus, the amount of the solder material 6 used is very small as compared with the case in which the gold ball 4 is not used. As a result, the heat produced by the ball-shaped solder material 6 when it is melted is absorbed by the gold ball 4 and radiated therefrom. Accordingly, the heat of the solder material 6 is transmitted to the slider 2 in a very small amount and thus does not injure the electromagnetic transducer element 2b of the slider 2. This is an important point to cause the gold ball 4 to act as the cushion (buffer).

In the embodiment, when the slider 2 as a defective product is discarded, it is exfoliated from the suspension 1, which is reworked and reused.

Next, a method of exfoliating the slider 2 according to the embodiment from the suspension 1 will be described.

That is, as shown in FIG. 1D, the slider 2 is exfoliated from the suspension 1 by melting the solder material 6 through which the gold ball 4 is joined to the bonding pad 1a of the suspension 1 by irradiating a fine beam-shaped heating light 9a thereto. With this operation, only the defective slider 2 is exfoliated and only the suspension 1 is collected.

Figure 6:
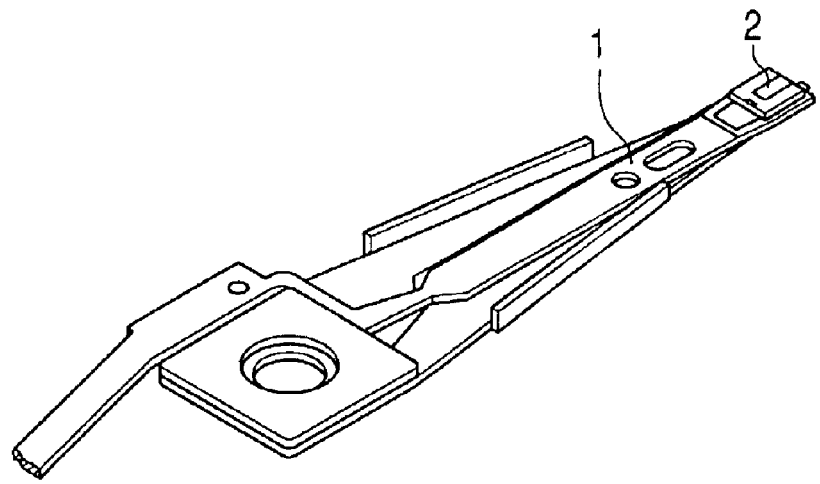
FIG. 6 is a perspective view showing a magnetic head.
Figure 7:
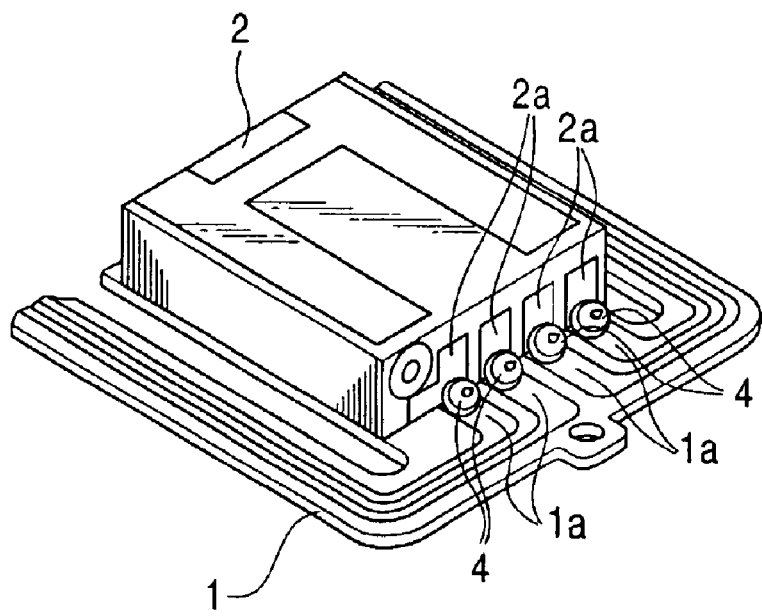
FIG. 7 is a perspective view showing a slider in an enlarged fashion.

The thus collected suspension 1 can be reworked and reused because the solder material 6 remains on the bonding pads 1a in a very small amount and no short-circuit is caused between adjacent bonding pads 1a through the remaining solder material 6 as shown in FIG. 6.

Since the exfoliated slider 2 is defective, no problem arises even if the heat produced by the solder material 6 when it is melted is transmitted to the slider 2. Further, a job for exfoliating the slider 2 can be performed in the atmosphere, thereby equipment for exfoliating the slider 2 can be simplified. Accordingly, a sufficient economic effect can be obtained by reworking and reusing the suspension 1 by reducing the cost of the equipment for exfoliating the slider 2 as far as possible.

Note that while the gold ball is used as the one joint member 4, the present invention is not limited thereto. Further, while the solder material 6 is formed in the ball shape, the present invention is not limited thereto and a solder wire may be used.

FIGS. 2A and 2B are sectional views showing a method of manufacturing a magnetic head according to another embodiment of the present invention in the sequence of manufacturing processes. In the embodiment, the gold ball 4 is pressed against the corner 10a of a jig 10 and malleably deformed in the process for joining the gold ball 4 to the bonding pad 2a of the slider 2 and attaching the ball-shaped solder material 6 to a part of the gold ball 4 as shown in FIG. 2A, thereby the surface area 4a of the gold ball 4 is increased as shown in FIG. 2B.

According to the embodiment, since the surface area 4a of the gold ball 4 for radiating the heat produced by the solder material 6 when it is joined is increased, the transmission of the heat of the solder material 6 to the electromagnetic transducer element 2b of the slider 2 can be more effectively shut off, thereby the electromagnetic transducer element 2b can be protected from the heat.

FIG. 3 is a sectional view showing a method of manufacturing a magnetic head according to still another embodiment of the present invention. In the embodiment, a gold material acting as the joint member 4 is rolled to a strip shape making use of the malleability of the gold material, and a resultant strip-shaped gold ribbon 4b is used in place of the gold ball 4.

According to the embodiment, since the gold ribbon 4b is rolled and malleably formed in the strip shape and the surface area thereof is increased, it is not necessary to increase the surface area of the gold material in the midway of the manufacturing processes as shown in FIGS. 2A and 2B, thereby the manufacturing processes can be simplified.

Figure 4A:
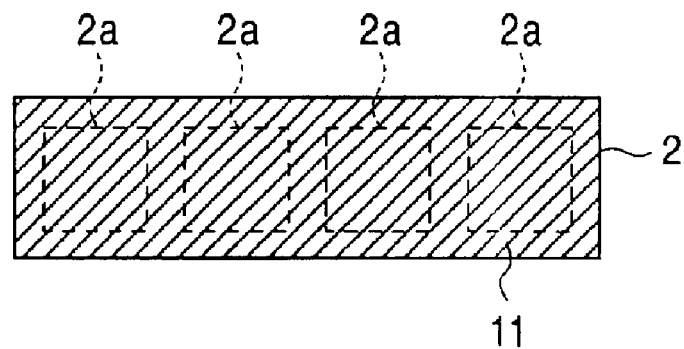
FIGS. 4A to 4C are sectional views showing a method of manufacturing a magnetic head according to a further embodiment of the present invention.
Figure 4B:
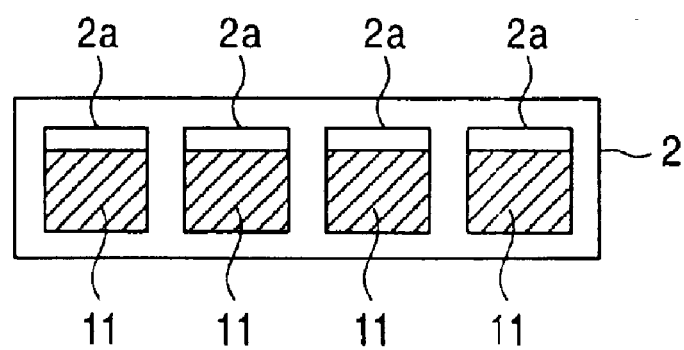
Figure 4C:
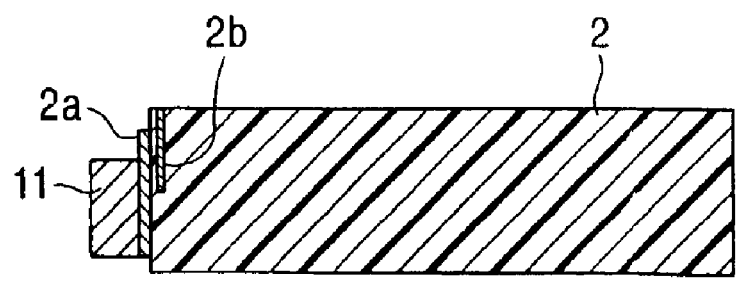
Figure 5A:
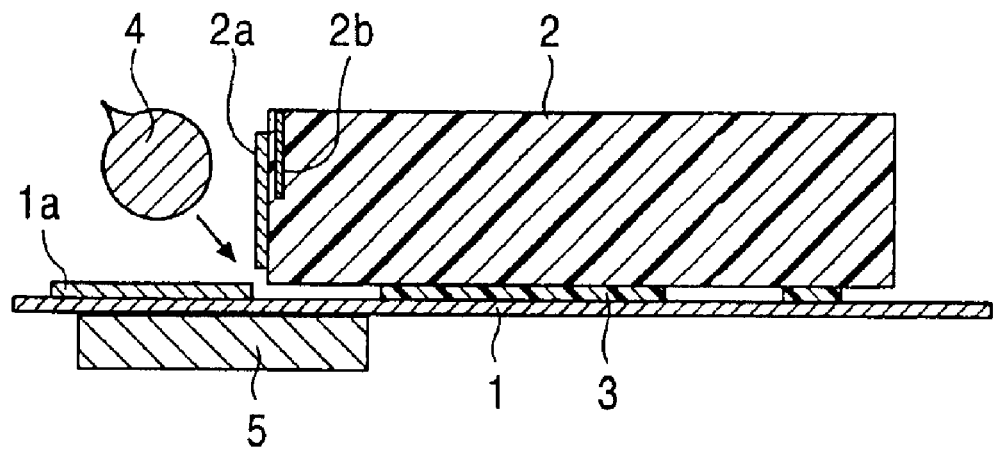
FIGS. 5A and 5B are sectional views showing a method of manufacturing a conventional magnetic head in the sequence of manufacturing processes.
Figure 5B:
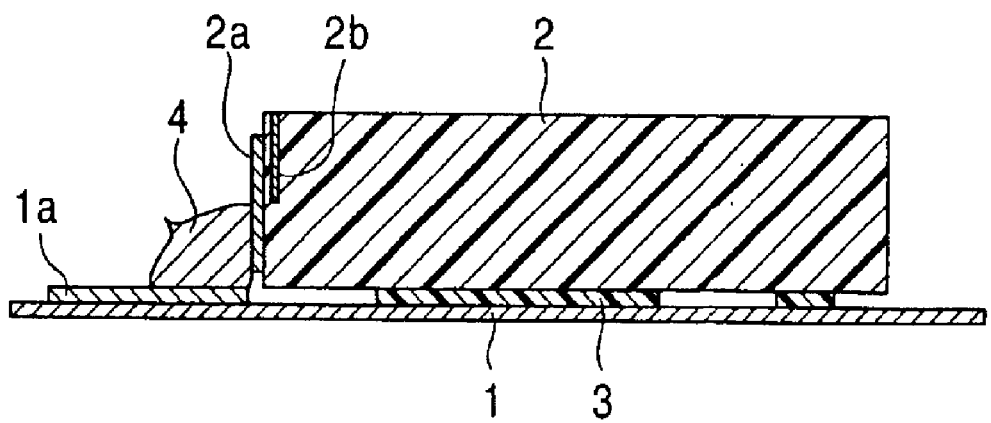

FIG. 4 is a sectional view showing a method of manufacturing a magnetic head according to a further embodiment of the present invention. In the embodiment, the end surface of the slider 2 except the bonding pads 2a is masked as shown in FIG. 4, and then a gold plating 11 is applied to the end surface of the slider 2 in a predetermined thickness using a plating method.

Next, as shown in FIG. 4B, only the portions of the gold platings 11 that are to be formed on the bonding pads 2a of the slider 2 are masked, and the gold platings is removed from the portions of the bonding pads 2a other than the masked portions, thereby the joint members 4 composed of the gold platings 11 are formed on the bonding pad 2a of the slider 2. Then, ball-shaped solder materials 6 (the other joint members 6) are attached to the gold platings 11 (the one joint members 4). The processes performed thereafter are the same as those performed in the embodiment shown in FIG. 1.

According to the embodiment, since the gold platings 11 (joint members 4) patterned using the plating method are formed on the bonding pads 2a of the slider 2, an adverse thermal effect is prevented from being exerted on the electromagnetic transducer elements 2b of the slider 2, thereby the electromagnetic transducer elements 2b can be protected from heat.

Note that the magnetic head for hard disc (HDD) has been described above in the aforementioned embodiments, the magnetic head of the present invention is not limited to the HDD magnetic head.

As described above, according to the present invention, the magnetic head has the joint structure most suitable to exfoliate a slider to which electromagnetic transducer elements are assembled as well as the structure for reliably fixing a slider to which acceptable electromagnetic transducer elements are assembled to a suspension can be obtained.

What is claimed is:

1. A method of manufacturing a magnetic head in which boning pads of a suspension are joined to bonding pads of a slider mounted on the suspension through at least two types of joint members, the slider has electromagnetic transducer elements assembled thereto, and the bonding pads of the slider are connected to the electromagnetic transducer elements, comprising:

joining a first of at least the two types of the joint members to each bonding pad of the slider;

attaching the first of the joint members to a second of the joint members of the at least two types of the joint members; and joining the first joint member to each bonding pad of the suspension through the second joint member, the first joint member having a melting point lower than the second joint member.

2. A method of manufacturing a magnetic head according to claim 1 comprising increasing a surface area of the first joint member by pressing the first joint member after the second joint member has been attached to the first joint member.

3. A method of manufacturing a magnetic head according to claim 1, comprising:

forming a wire member acting as the first joint member in a spherical shape; and joining the spherical wire member to each bonding pad of the slider by applying an ultrasonic wave to the wire member in the state that the wire member is in press-contact with each bonding pad of the slider.

4. A method of manufacturing a magnetic head according to claim 1, comprising forming the first joint member on each bonding pad of the slider using a plating method.

5. A method of manufacturing a magnetic head according to claim 1, comprising joining the first joint member to each bonding pad of the suspension by using solder as the second joint member and melting the solder.

6. A method of manufacturing a magnetic head according to claim 1 wherein the first joint member is solder and the second joint member is gold.

7. A method of manufacturing a magnetic head according to claim 1 wherein the first joint member is substantially larger than the second joint member.

8. A method of manufacturing a magnetic head according to claim 1 further comprising dissipating heat from the first joint member using the second joint member without melting the second joint member.

9. A method of manufacturing a magnetic head according to claim 1 further comprising dissipating heat from the first joint member using the second joint member without transmitting enough of the heat to the slider to deteriorate an electromagnetic transducer element of the slider.

* * * * *